(12) United States Patent
Dyer et al.

(10) Patent No.: US 7,842,592 B2
(45) Date of Patent: Nov. 30, 2010

(54) CHANNEL STRAIN ENGINEERING IN FIELD-EFFECT-TRANSISTOR

(75) Inventors: Thomas Dyer, Pleasant Valley, NY (US); Rajendran Krishnasamy, Essex Junction, VT (US); Jin-Ping Han, Fishkill, NY (US); Ernst Demm, Putnam Valley, NY (US)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 483 days.

(21) Appl. No.: 11/760,056

(22) Filed: Jun. 8, 2007

(65) Prior Publication Data
US 2008/0305621 A1 Dec. 11, 2008

(51) Int. Cl.
*H01L 21/3205* (2006.01)
*H01L 21/4763* (2006.01)
(52) U.S. Cl. .............................. 438/585; 257/E21.294

(58) Field of Classification Search .................. 438/585; 257/E21.294
See application file for complete search history.

(56) References Cited

U.S. PATENT DOCUMENTS

| 6,225,173 | B1 | 5/2001 | Yu |
| 2006/0160317 | A1 | 7/2006 | Zhu et al. |
| 2007/0090462 | A1 | 4/2007 | Wu et al. |
| 2007/0096184 | A1 | 5/2007 | Akamatsu |
| 2007/0126036 | A1 | 6/2007 | Ohta et al. |
| 2007/0132038 | A1* | 6/2007 | Chong et al. ................. 257/401 |

* cited by examiner

*Primary Examiner*—Matthew C Landau
*Assistant Examiner*—Sonya D McCall-Shepard
(74) *Attorney, Agent, or Firm*—Yuanmin Cai (57) ABSTRACT

There is disclosed a method of applying stress to a channel region underneath a gate of a field-effect-transistor, which includes the gate, a source region, and a drain region. The method includes steps of embedding stressors in the source and drain regions of the FET; forming a stress liner covering the gate and the source and drain regions; removing a portion of the stress liner, the portion of the stress liner being located on top of the gate of the FET; removing at least a substantial portion of the gate of a first gate material and thus creating an opening therein; and filling the opening with a second gate material.

19 Claims, 13 Drawing Sheets

CHANNEL STRAIN ENGINEERING IN FIELD-EFFECT-TRANSISTOR

FIELD OF THE INVENTION

The present invention relates to the field of semiconductor device manufacturing. In particular, it relates to the engineering of channel strain in field-effect-transistors through gate replacement and/or selective use of gate material.

BACKGROUND OF THE INVENTION

In the field of semiconductor device manufacturing, active semiconductor devices such as, for example, transistors are normally manufactured or fabricated by front end of line (FEOL) technologies. A transistor may include, for example, a field-effect-transistor (FET) such as a complementary metal-oxide-semiconductor (CMOS) FET. Among FET transistors may be a p-type doped FET (PFET) or an n-type doped FET (NFET). Different types of FET transistors may be formed or manufactured on a common substrate of semiconductor chip or a common semiconductor structure.

In order to improve device performance such as operational speed by enhancing carrier mobility in the channel of a FET, following forming the gate structure of the FET, stresses are normally induced into the channel region of the FET through, for example, applying stress liners. A compressive stress liner is normally applied to a PFET transistor and a tensile stress liner applied to an NFET transistor due to different types of carriers. Both stress liners may be formed by following a conventional dual stress liner (DSL) process, or more recently a self-aligned dual stress liner process (SADSL). Other techniques for engineering strain in the channel of a FET may include, for example, embedding silicon germanium (SiGe) in the source/drain regions of a PFET transistor so as to more effectively apply stress towards the channel of the PFET transistor.

With the continued pursuing for high-performance semiconductor devices, there is a need to further improve the engineering of strain in the channel region of field-effect-transistors. This may include, for example, improving the effectiveness of stress liners and in some instances even in the absence of such stress liners.

SUMMARY OF THE INVENTION

Embodiments of the present invention provide a method of applying stress to a channel region underneath a gate of a field-effect-transistor, which includes the gate, a source region, and a drain region. The method includes embedding stressors in the source and drain regions; forming a stress liner covering the gate and the source and drain regions; removing a portion of the stress liner, the portion of the stress liner being located on top of the gate; removing at least a substantial portion of the gate of a first gate material and thus creating an opening therein; and filling the opening with a second gate material.

Embodiments of the present invention further provide a method of, after filling the opening with the second gate material, removing the stress liner that covers the source and drain regions; and a method of, after removing the stress liner covering the source and drain regions, forming a new stress liner covering the gate of the second gate material and the source and drain regions of the FET.

According to one embodiment, the first gate material may have a Young's modulus value being smaller than 130 GPa, preferably smaller than 115 GPa, and more preferably smaller than 100 GPa. The first gate material may be selected from the group consisting of $Si_{0.8}Ge_{0.2}$, $SiO_{0.5}Ge_{0.5}$, Ge, GaP, GaAs, $Al_{0.5}Ga_{0.5}As$, AlAs, InP, InAs, ZnO, ZnS, ZnSe, CdS, and CdTe. According to another embodiment, the second gate material may have a Young's modulus value being equal to or larger than 130 GPa.

Embodiments of the present invention provide a method of applying stress to a channel region underneath a gate of a field-effect-transistor, which includes the gate, a source region, and a drain region. The method includes forming the gate of the FET with a gate material, the gate material having a Young's modulus value being smaller than 130 GPa, preferably smaller than 115 GPa, and more preferably smaller than 100 GPa; and forming a stress liner covering the gate and the source and drain regions of the FET.

Embodiments of the present invention provide a method applying stress to a channel region underneath a gate of a field-effect-transistor. The method includes embedding stressors in a source and drain regions of the FET; forming a stress liner covering a gate of the FET and the source and drain regions; removing a portion of the stress liner that is located on top of the gate; removing the gate of a first gate material and a layer of a first gate oxide underneath, thus creating an opening therein; filling the opening with a layer of a second gate oxide; and filling a second gate material on the layer of said second gate oxide.

BRIEF DESCRIPTION OF THE DRAWINGS

The present invention will be understood and appreciated more fully from the following detailed description of the invention, taken in conjunction with the accompanying drawings of which.

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION OF THE INVENTION

In the following detailed description, numerous specific details are set forth in order to provide a thorough understanding of embodiments of the invention. However, it will be understood by those of ordinary skill in the art that embodiments of the invention may be practiced without these specific details. In the interest of not obscuring presentation of essences and/or embodiments of the present invention, in the following detailed description, processing steps and/or operations that are well known in the art may have been combined together for presentation and/or for illustration purpose and in some instances may not have been described in detail. In other instances, processing steps and/or operations that are well known in the art may not be described at all. A person skilled in the art will appreciate that the following descriptions have rather focused on distinctive features and/or elements of embodiments of the present invention.

In semiconductor manufacturing industry, various types of active semiconductor devices such as transistors, including CMOS FET of n-type (NFETs) and p-type (PFETs), may be created or formed on a single substrate of semiconductor by applying well-known FEOL processing technologies. The well-known FEOL technologies may include processing steps and/or operations of, inter alia, cap deposition, photo-resist-mask formation, photolithography, hard-mask formation, wet etching, reactive-ion etching (RIE), ion-implantation, and chemical-mechanical polishing (CMP), to list a few. During and/or after the formation of transistors, stress liners of the same or different types may be applied to the transistors, i.e., NFETs and PFETs, for device performance improvement. Improvement in device performance may come from improved mobility of electrons in the channel region of NFETs and/or holes in the channel region of PFETs brought by strains induced by the stress liners.

In the following detailed description, well-known device processing techniques and/or steps may not be described in detail and, in some instances, may be referred to other published articles or patent applications in order not to obscure the description of the essence of presented invention as further detailed herein below.

Figure 1:
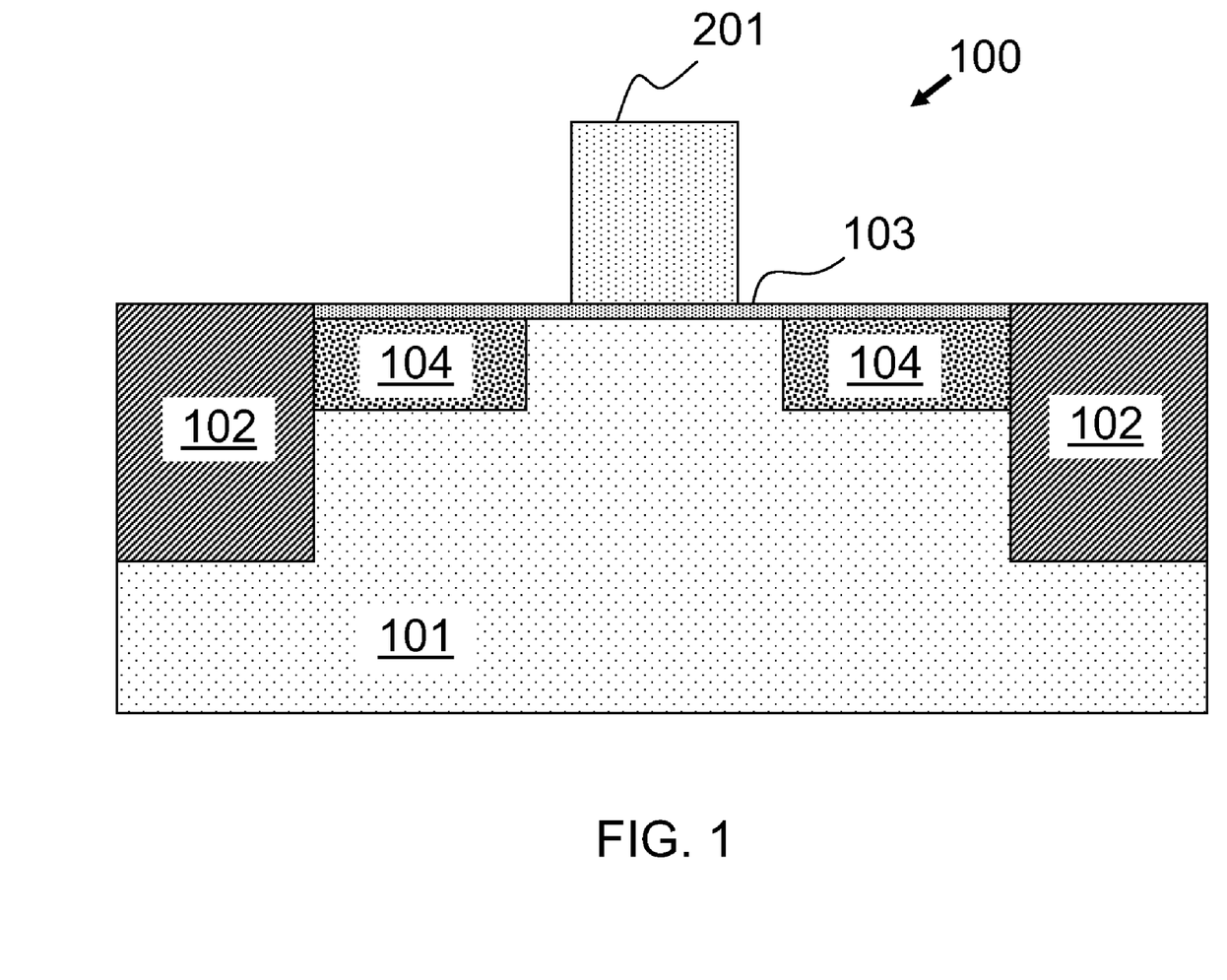
FIGS. 1-8 are demonstrative illustrations of a method of forming a field-effect-transistor with gate replacement according to embodiments of the present invention.

FIGS. 1-8 are demonstrative illustrations of a method of forming a field-effect-transistor with gate replacement according to embodiments of the present invention. For example, FIG. 1 illustrates a step of forming a field-effect-transistor (FET) 100 on a semiconductor substrate 101. FET 100 may be electrically separated from other FETs or semiconductor devices by shallow trench isolation (STI), e.g., STI 102, embedded in substrate 101. The formation of FET 100 may include forming or depositing a dielectric layer 103, e.g., oxide, on a top surface of substrate 101; patterning gate conductor 201, e.g., polysilicon, on top of dielectric layer 103; and embedding stressors 104, e.g., silicon-germanium (SiGe) or silicon-carbon (SiC), in the source and drain regions next to gate conductor 201.

Although not specifically illustrated in FIG. 1, according to some embodiments of the present invention, the formation of FET 100 may also include other well known steps such as, for example, forming spacers on the two sides of gate conductor 201, forming source and drain defined by the spacers, forming silicide at the top surfaces of source, drain, and gate for contact, et al. According to some other embodiments, the formation of spacers, source and drain, and/or silicide may be performed at a later stage after the gate replacement process as described below in more details. In any case, in order not to obscure the essence of the present invention, a person skilled in the art may refer to other published articles and/or patents for details of these steps of forming a FET.

Figure 2:
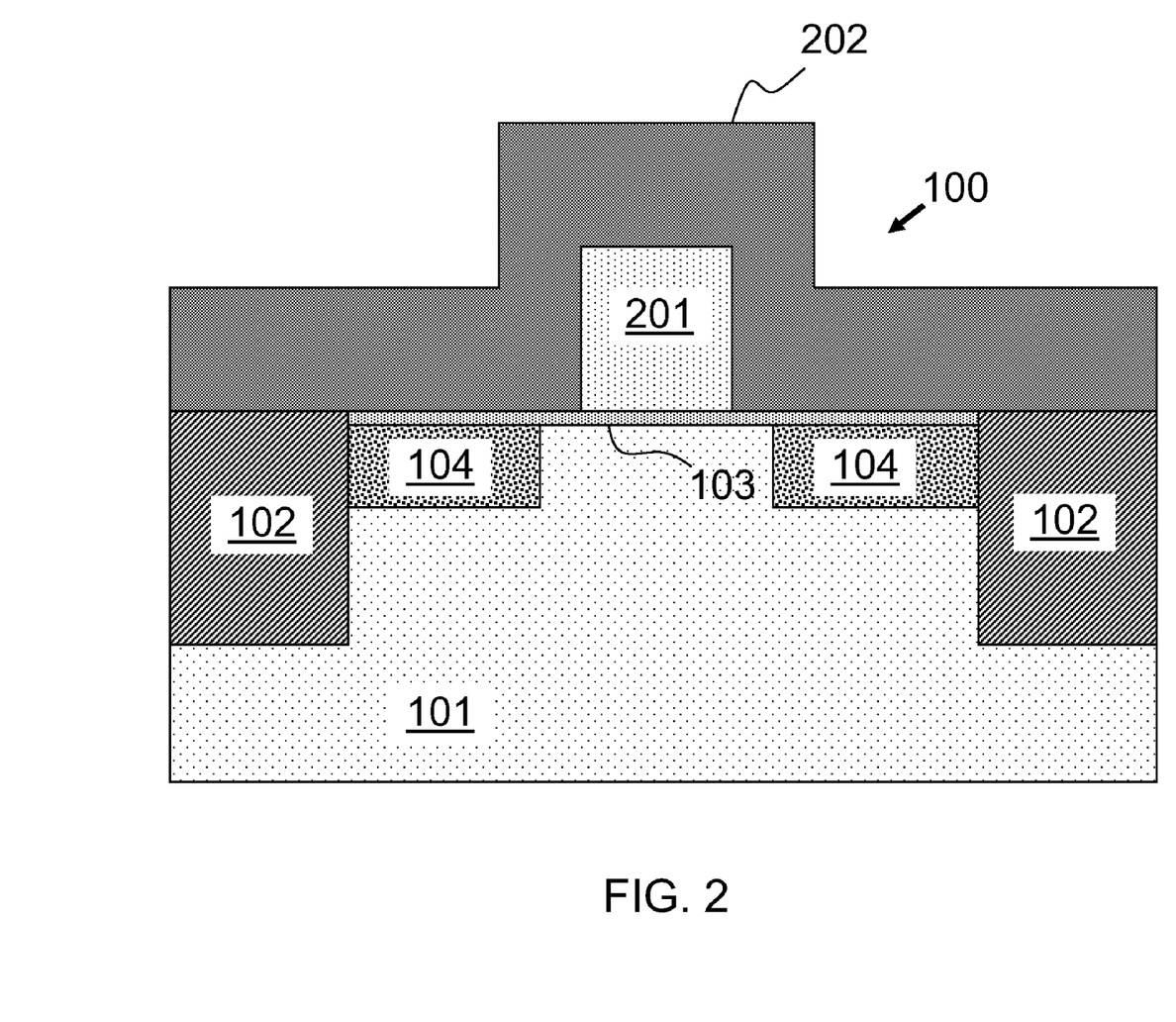

FIG. 2 illustrates a step of forming FET 100 following the step shown in FIG. 1. Specifically, a stress liner 202 may be subsequently formed on top of FET 100, which may apply stress toward the channel region of FET 100 underneath gate conductor 201. Stress liner 202 may be a compressive stress liner, a tensile stress liner, or a dual stress liner. In the case of a p-type doped FET (PFET) 100, a compressive stress may be applied by stress liner 202, which may be formed on top of PFET 100 through deposition in a, for example, plasma-enhanced chemical vapor deposition (PECVD) process. Other well-known methods other than PECVD may be used in forming stress liner 202 as well. Stress liner 202 may be a compressive nitride liner or compressive oxide liner. However, a person skilled in the art will appreciate that compressive stress liner may not be limited to nitride liner or oxide liner and other compressive liner materials may be used as well.

According to one embodiment, in the case of an n-type doped FET (NFET), a tensile stress may be applied by stress liner 202. According to yet another embodiment, stress liner 202 may have a stress substantially close to zero. In other words, a non-stress liner 202 may be used as well in the process of gate replacement as described below in more detail.

Assuming FET 100 is a PFET without losing generality, in order to enhance the effectiveness of compressive stress liner 202 in exerting stress in the channel region of FET 100, according to some embodiment of the present invention, in the previous step (FIG. 1) of forming gate conductor 201, which may be referred to as a replacement gate or dummy gate, conductive materials with low Young's modulus may be used. For example, polysilicon (Si) is well known as suitable for gate conductor and has a nominal value of Young's modulus around 130 GPa. However, gate conductor material made of a compound of silicon (Si) and germanium (Ge) may have a Young's modulus smaller than that of Si, typically between 103 and 130 GPa. For example, Young's modulus of $Si_{0.8}Ge_{0.2}$ is around 124 and $Si_{0.5}Ge_{0.5}$ is around 116, while germanium (Ge) has a Young's modulus value around 103.

Table 1 lists some of possible candidates for gate conductor. Along with their Young's modulus values, table 1 also provides the respective melting point, mobility factor, and band gap values for each of the candidates.

TABLE 1

Candidate material for gate conductor

| Material | Young's modulus (GPa) | Melting point (C.) | Mobility factor | Band gap (eV) |
|---|---|---|---|---|
| Si | 130 | 1412 | 1 | 1.12 |
| $Si_{0.8}Ge_{0.2}$ | 124 | 1275 | 1.05 | 1.03 |
| $Si_{0.5}Ge_{0.5}$ | 116 | 1109 | 1.12 | 0.891 |
| Ge | 103 | 938 | 1.26 | 0.661 |
| GaP | 103 | 1457 | 1.26 | 2.26 |
| GaAs | 85.3 | 1240 | 1.52 | 1.424 |
| Al0.5Ga0.5As | 84.4 | 1351 | 1.54 | 1.8 |
| AlAs | 83.5 | 1740 | 1.56 | 2.168 |
| InP | 61.1 | 1062 | 2.13 | 1.344 |
| InAs | 51.4 | 942 | 2.53 | 0.354 |
| ZnO | 108 | 1975 | 1.20 | 3.2 |
| ZnS | 74.4 | 1718 | 1.75 | 3.54 |
| ZnSe | 70 | 1525 | 1.86 | 3.10 |
| CdS | 50 | 1750 | 2.6 | 2.42 |
| CdTe | 52 | 1041 | 2.5 | 1.56 |

A person skilled in the art will appreciate that most of the materials listed in Table 1 have a Young's modulus smaller than that of silicon of 130 GPa. In particular, the listed materials include $Si_{0.8}Ge_{0.2}$, $Si_{0.5}Ge_{0.5}$, Ge, GaP, GaAs, $Al_{0.5}Ga_{0.5}As$, AlAs, InP, InAs, ZnO, ZnS, ZnSe, CdS, and CdTe. Materials with smaller Young's modulus, once used for replacement gate 201, may exhibit relatively smaller resistance to an external force being applied thereupon, and thus the compressive stress applied by stress liner 202 may be more effectively transferred to the channel region of FET 100.

Figure 3:
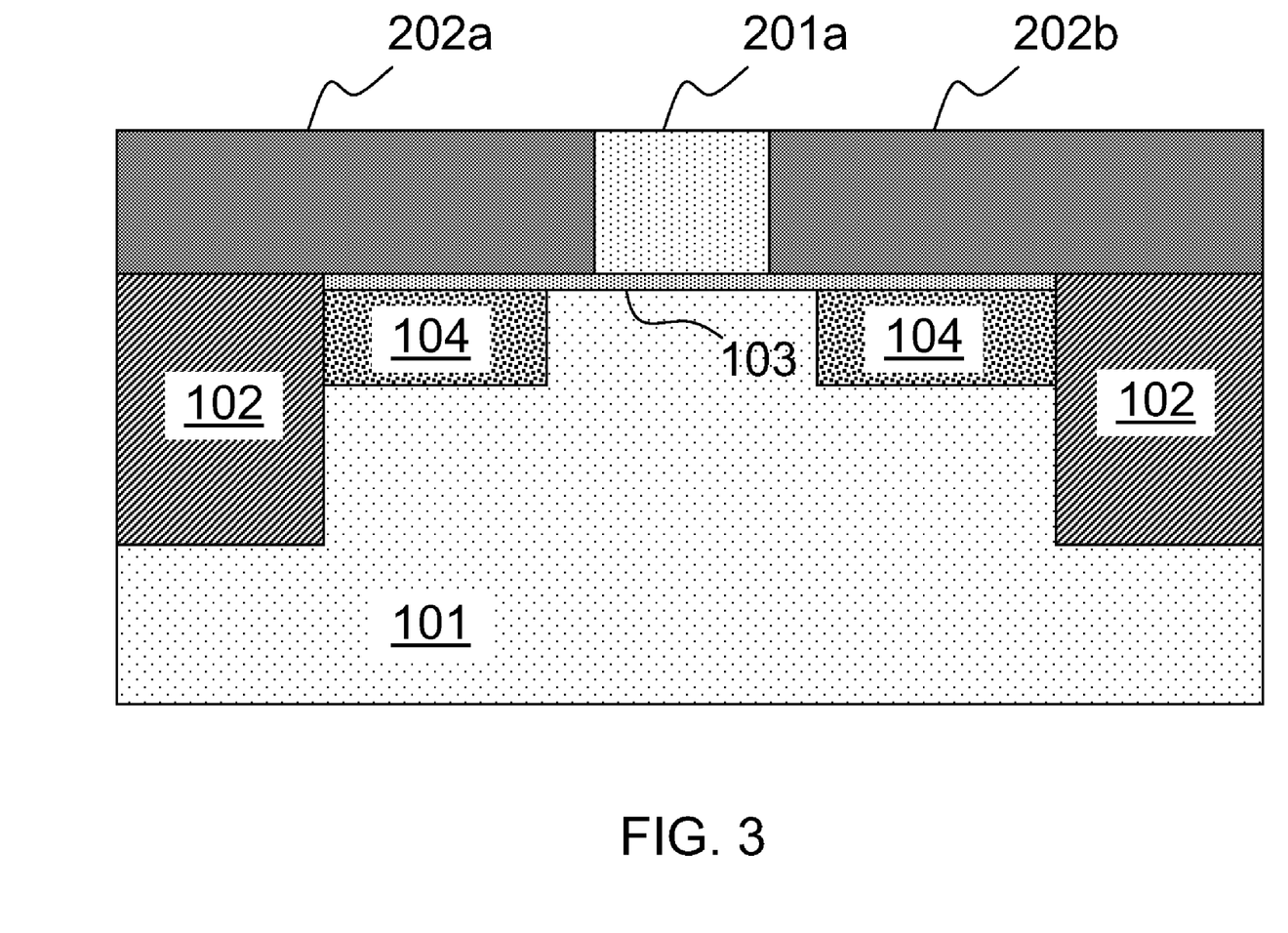

FIG. 3 illustrates a step of forming FET 100 following the step shown in FIG. 2 in order to further strengthen the strain effect brought by stress liner 202. More specifically, a top portion of stress liner 202 may be removed to expose gate conductor or replacement gate 201 underneath. The removal of stress liner 202 at the top of gate conductor 201 may be through well-known processes such as a chemical-mechanical-polishing (CMP) process, which may create a co-planar surface 202a, 202b at the top of stress liner 202 and 201a at the top of gate conductor 201. The selective removal of stress liner 202 at the top of replacement gate 201 may cause at least partial relaxation of stresses by stress liner 202 in the direction to enhance the strain effect in the channel region underneath replacement gate 201. Further relaxation may be obtained in a gate replacement process as described below in more detail, according to embodiments of the present invention.

Figure 4:
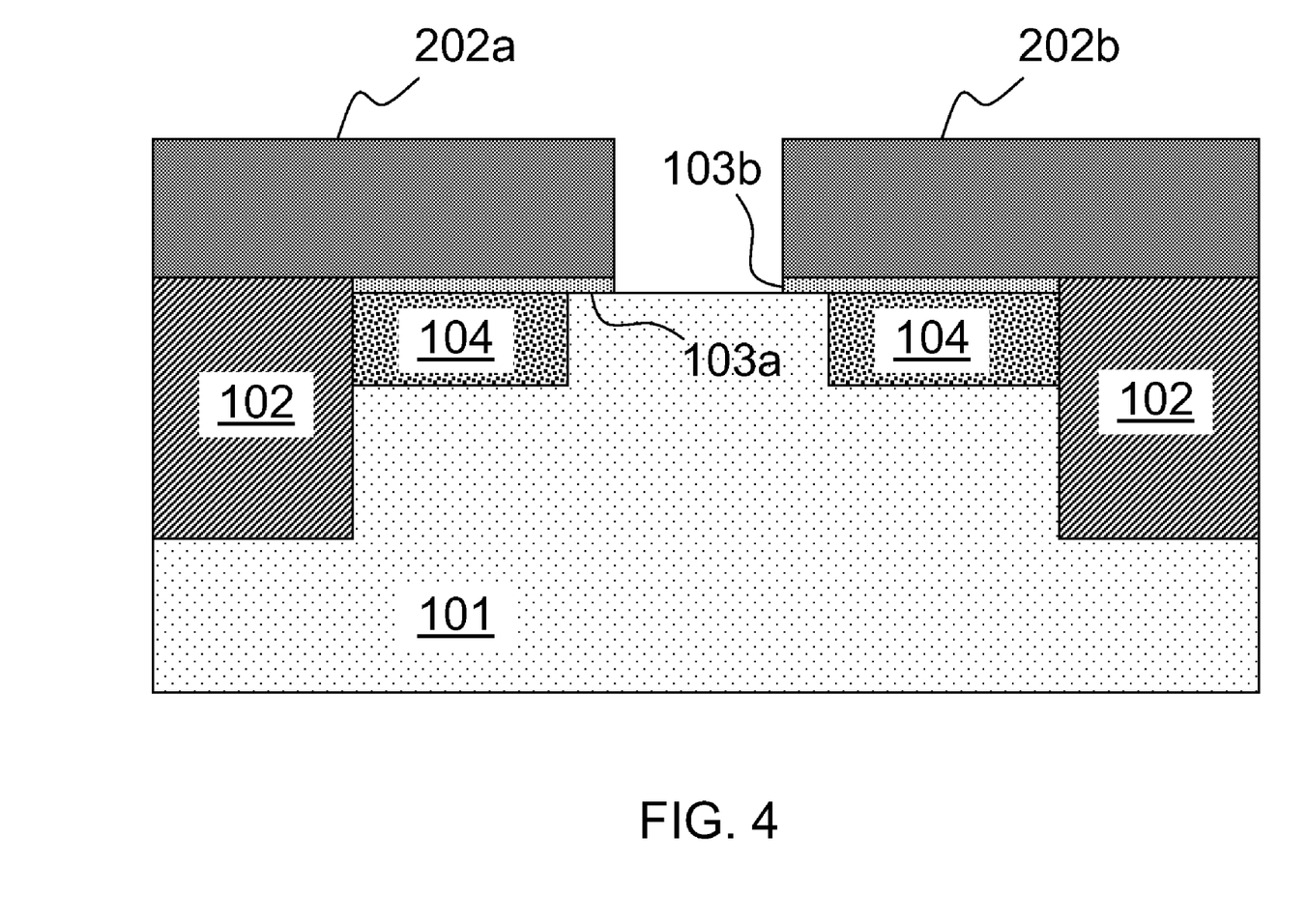

FIG. 4 illustrates a step of forming FET 100 following the step shown in FIG. 3 after the top of gate conductor 201 is exposed. The exposed gate conductor 201 may be subsequently removed through, for example, a RIE etching process in which the etchant or etchants used may be selected such that the etching process is selective to the gate conductor material. In other words, the etching of gate conductor 201 may leave nitride stress liner 202a and 202b substantially intact. The selection of etchants for performing selective RIE etching is well-known in the art and will not be described in further details. Following the removal of gate conductor 201, portion of dielectric oxide 103 exposed by the removal of gate conductor 201 may be selectively removed as well to expose the underneath channel region of FET 100, leaving only layer 103a under liner 202a and layer 103b under liner 202b. However, embodiments of the present invention are not limited in this respect. For example, according to some embodiments, dielectric oxide layer 103 underneath gate conductor 201 may be left intact or substantially intact, in which case the regrowth of a dielectric oxide layer in the opened gate region (as described below in detail) may not be necessary. In one embodiment, layers 103a and 103b may be silicide over source and drain regions 104 as electrical contact for FET 100.

According to one embodiment, the removal of gate conductor or replacement gate 201 allows stress liner 202 to further relax, resulting in a more effective transfer of stresses from the two sides of the channel, including those from stress liner 202 and stressor 104 and any other possible sources, to the channel region of FET 100. Even in the case of a non-stress liner 202, the removal of replacement gate 201 will still allow stresses from stressor 104 to be transferred to the channel region. It shall be noted that a person skilled in the art will appreciate that stressor 104 may include embedded SiGe, embedded SiC, or any other types of stressors which may be formed by any future technologies.

Figure 5:
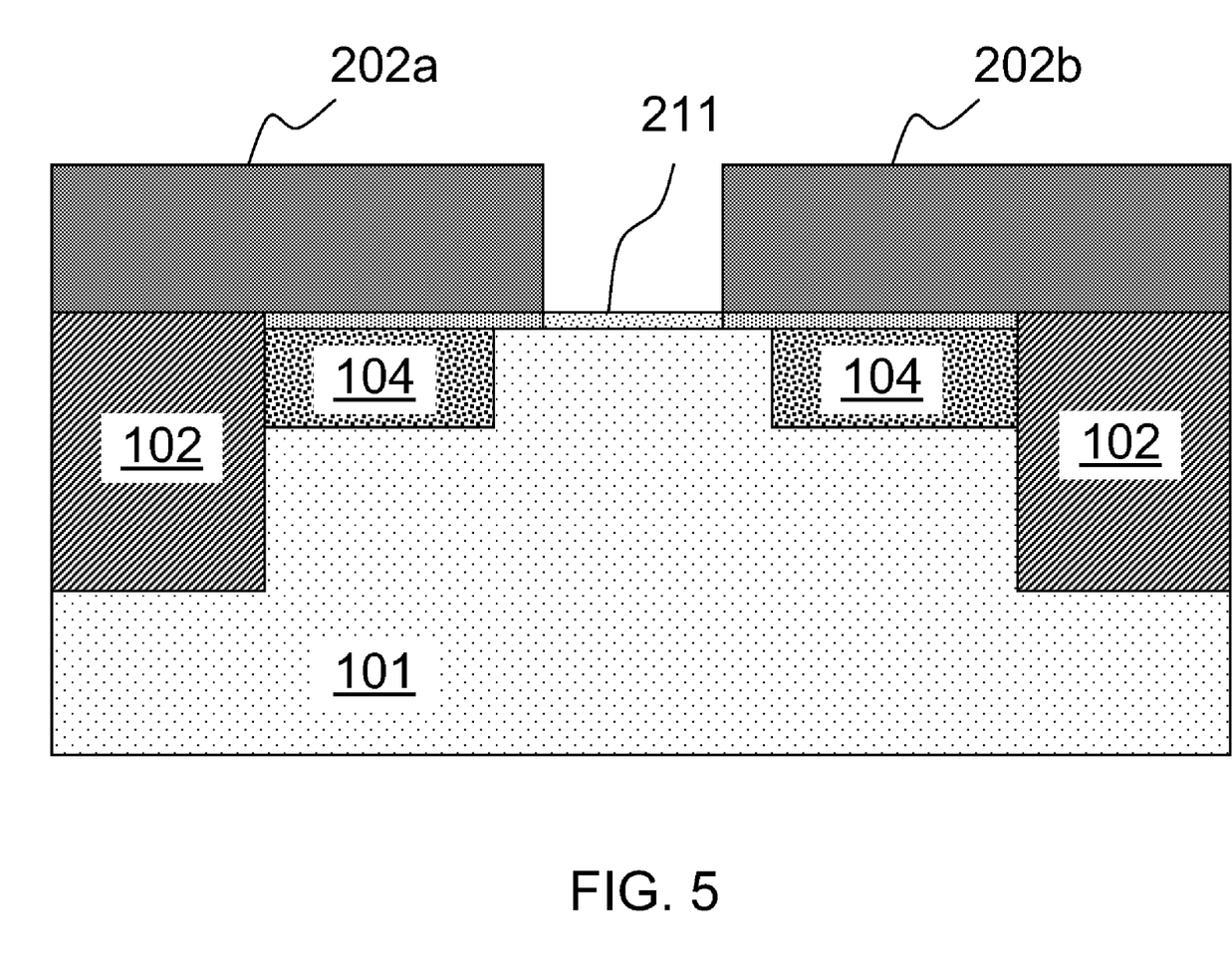

FIG. 5 illustrates a step of forming FET 100 following the step shown in FIG. 4 after both gate conductor 201 and dielectric layer 103 underneath have been removed. A new dielectric layer 211 may be formed in the opening directly on top of the channel region. Dielectric layer 211 may be a gate oxide layer.

Figure 6:
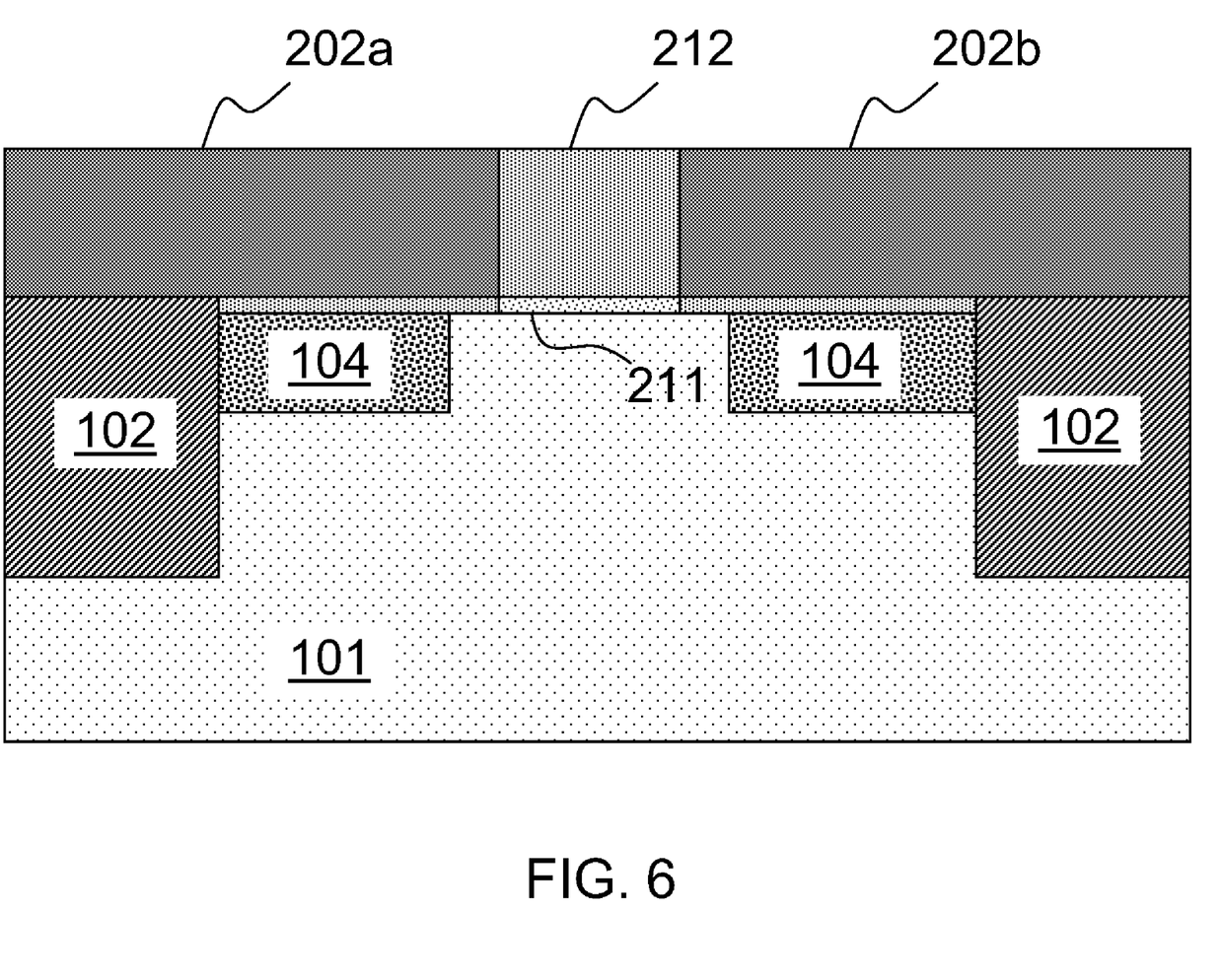

FIG. 6 illustrates a step of forming FET 100 following the step shown in FIG. 5 after gate oxide layer 211 is formed. Directly on top of gate oxide layer 211, a new gate 212 may be formed through for example deposition in the opening between stress liner 202. Deposition of gate 212 may be followed by a planarization process such as a CMP process to form a surface which may be coplanar with surface 202a and 202b. Gate 212 may be a relaxed gate conductor of material such as, for example, polysilicon, tungsten (W), or metal silicide. However, the present invention is not limited in this respect and other type of gate materials may be used as well, including any suitable thin layer being placed between the gate and the gate oxide layer 211 underneath in order to protect the gate oxide.

Figure 7:
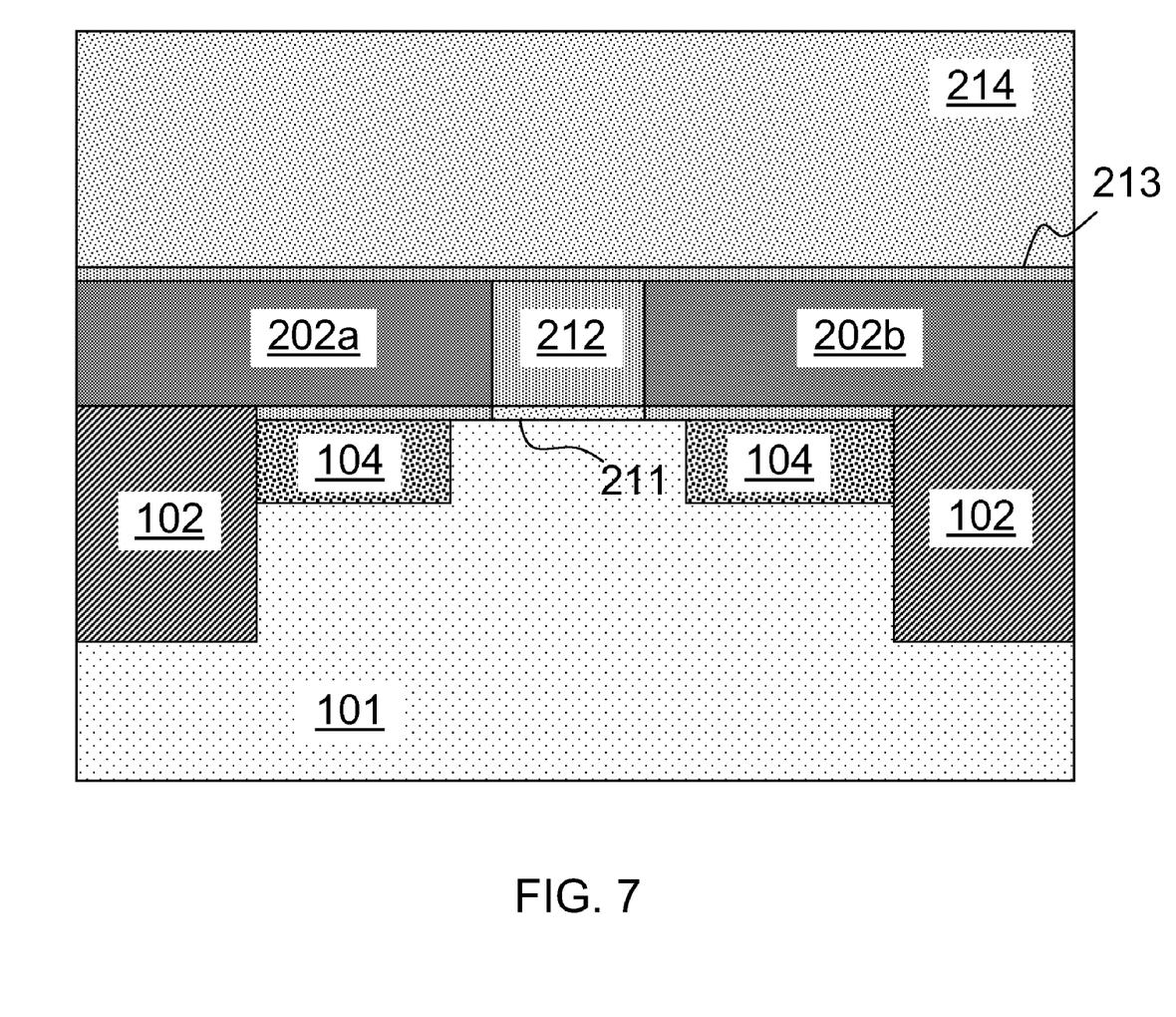
Figure 8:
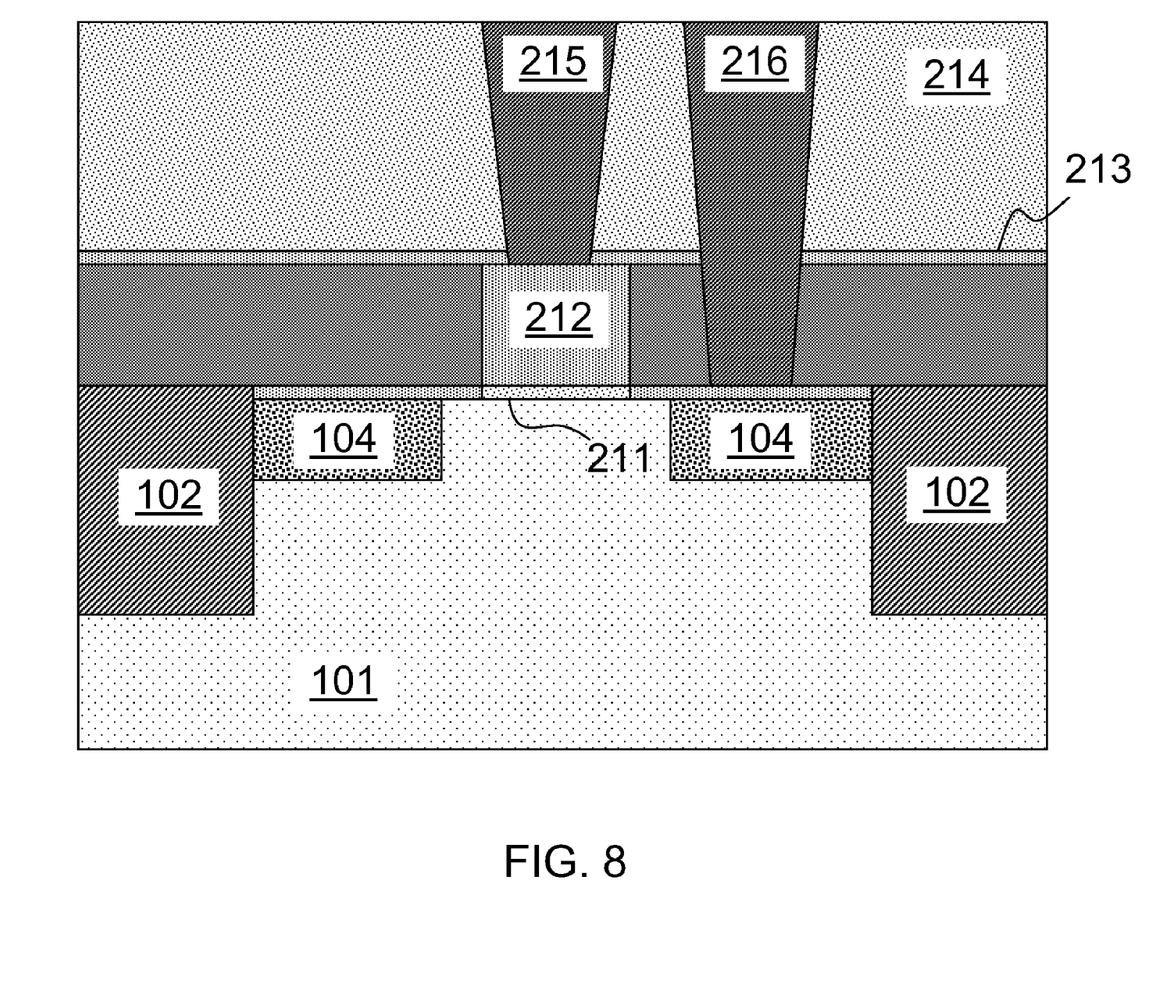

FIG. 7 illustrates a step of forming FET 100 following the step shown in FIG. 6 after forming gate 212. A relaxed nitride diffusion barrier layer 213 may be optionally formed on top of stress liner 202 and gate 212, thereupon an inter-level dielectric (ILD) layer 214 may be formed as is well known in the art. Diffusion barrier layer 213 may protect ILD layer 214 from contamination from nitride stress liner 202. In a next step as shown in FIG. 8, metal contacts 215 and 216 may be formed through well-known etching and deposition process. For example, metal contact 215 may be formed to contact gate 212 and metal contact 216 may be formed to contact source/drain in the embedded SiGe region 104, possibly through silicide 103a and 103b.

Figure 9:
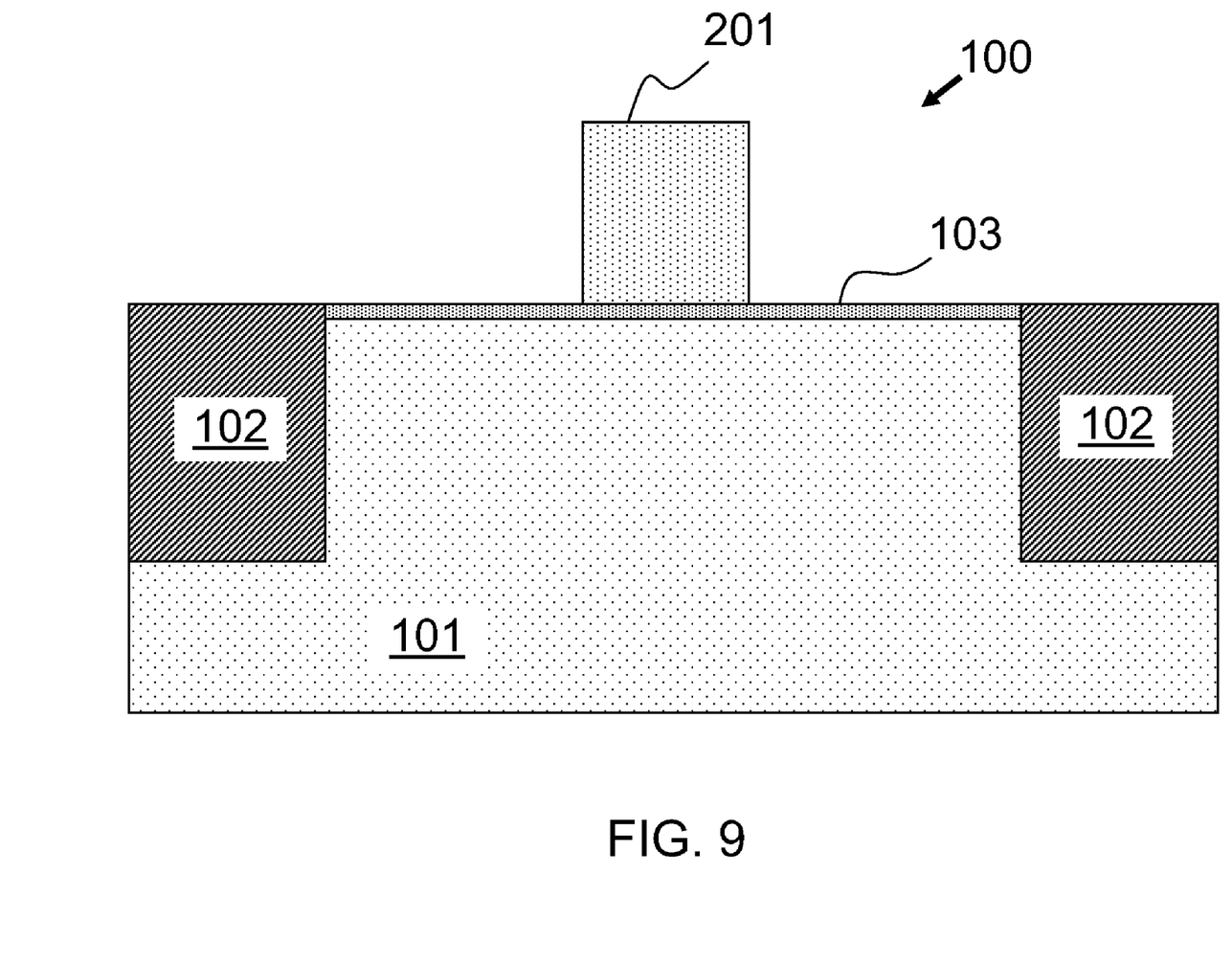
FIGS. 9-13 are demonstrative illustrations of alternative steps in methods of forming a field-effect-transistor according to embodiments of the present invention.

According to an alternative embodiment of the present invention, the gate replacement process as described in FIGS. 2-6 may be applied early in the stage in forming FET 100, and may be applied in situations where no embedded silicon-germanium is formed in the source/drain regions. For example, as illustrated in FIG. 9, processing steps as described above may be applied after replacement gate 201 is formed on top of semiconductor substrate 101 via gate dielectric layer 103. According to this embodiment, after material of replacement gate 201 is removed to form an opening inside stress liner 202 (as shown in FIG. 4), stress from stress liner 202 may be transferred effectively to the channel regions in the substrate underneath the opening. However, the present invention is not limited in this respect and any other types of stresses applied by stressors (e.g., stress liner, eSiGe, etc.) from the two sides of replacement gate 201 may be effectively transferred to the channel region of FET 100 after the gate material 201 is removed.

Figure 10:
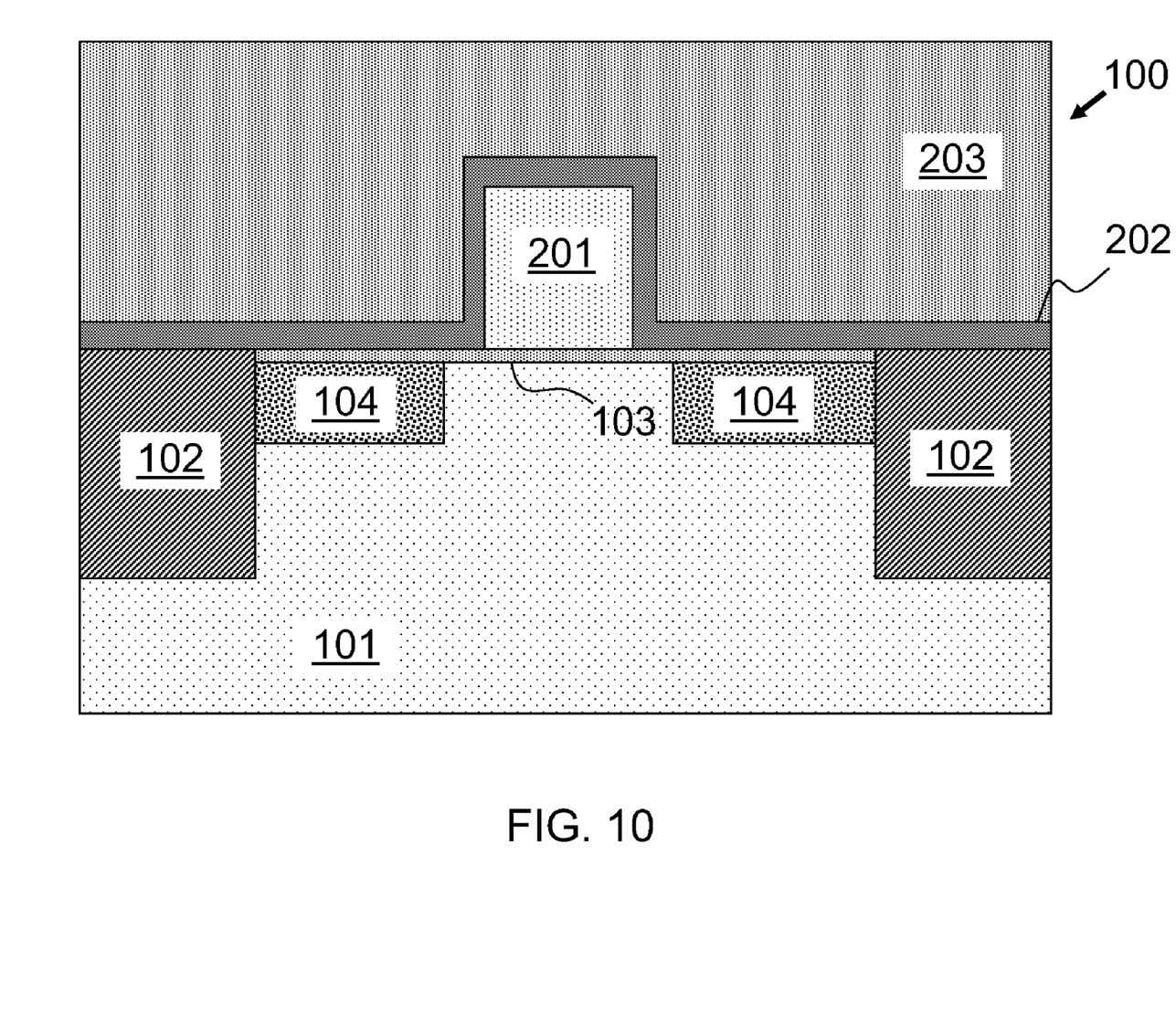

In FIG. 2 as part of the gate replacement process, stress liner 202 is formed on top of gate 201 (dummy gate or replacement gate), which step is then followed by a planarization (CMP) step to open the top of gate 201 in preparation for the removal of the dummy gate 201. However, the present invention is not limited in this respect. For example, as illustrated in FIG. 10, in the case that the thickness of nitride stress liner 202 is less than the height of gate 201, additional layer or layers, such as an oxide layer 203, may be formed until the top of gate 201 is covered such that a CMP process may be subsequently applied. Here, a person skilled will appreciate that stress liner 202 may not be limited to nitride stress liner and, so long as stressors (e.g., eSiGe 104 in FIG. 10) have been formed at the two sides of replacement gate 201, stress liner 202 may not be even a stress liner and may be a regular non-stress liner. According to one embodiment, the formation of stress liner 202 may be optional.

Figure 11:
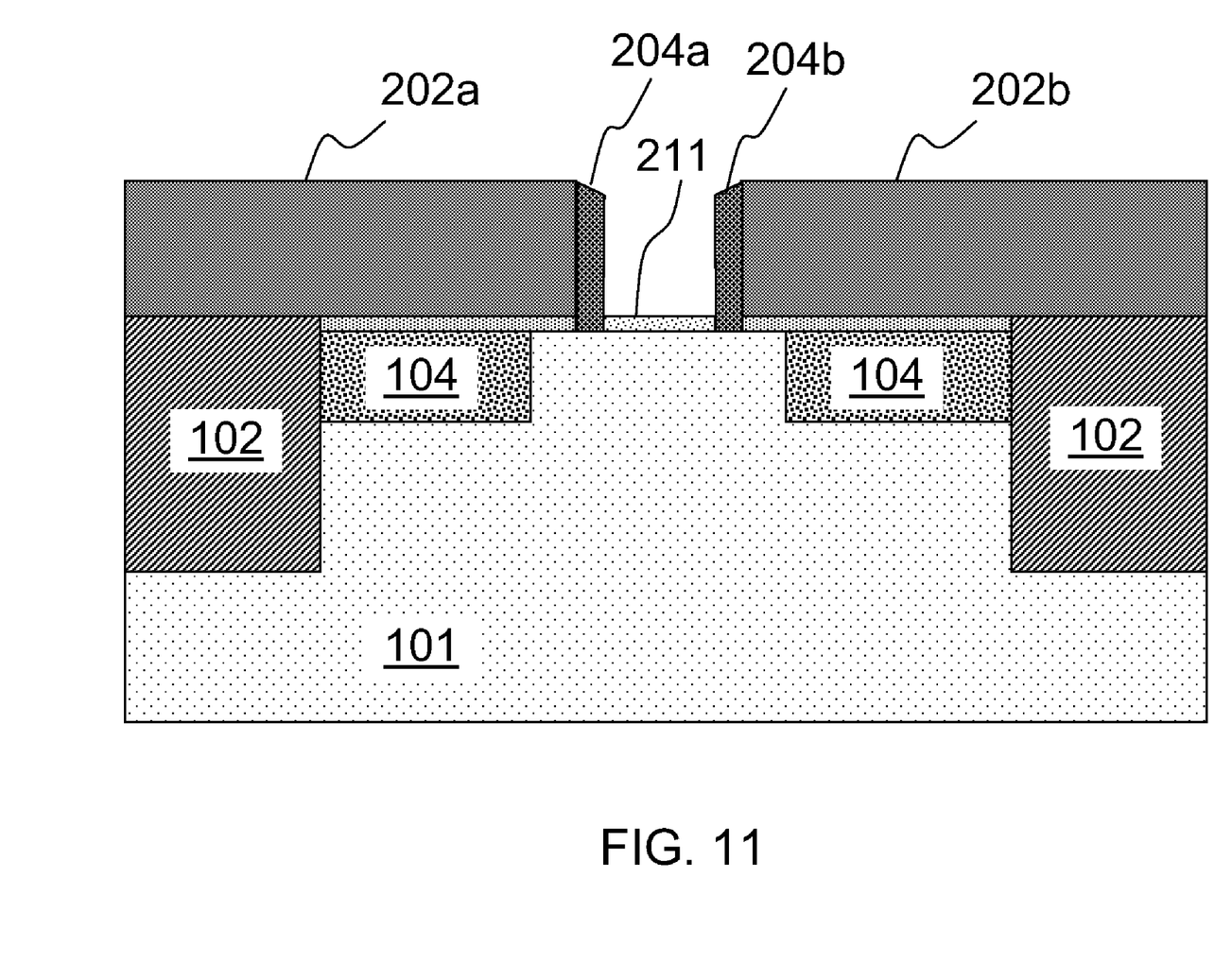

According to one embodiment, following the removal of replacement gate 201 as in FIG. 4 and depending on the stage of forming FET 100, spacers 204a and 204b may be formed on the sidewalls of stress liner 202 in the opening as illustrated in FIG. 11. Spacers 204a and 204b may be tailored to define the width of gate conductor formed therein and away from the source/drain and their extension regions. Following the formation of spacers 204a and 204b, dielectric oxide layer 211 and gate conductor 212 may be formed as described in FIGS. 5-6 in between spacers 204a and 204b.

Figure 12:
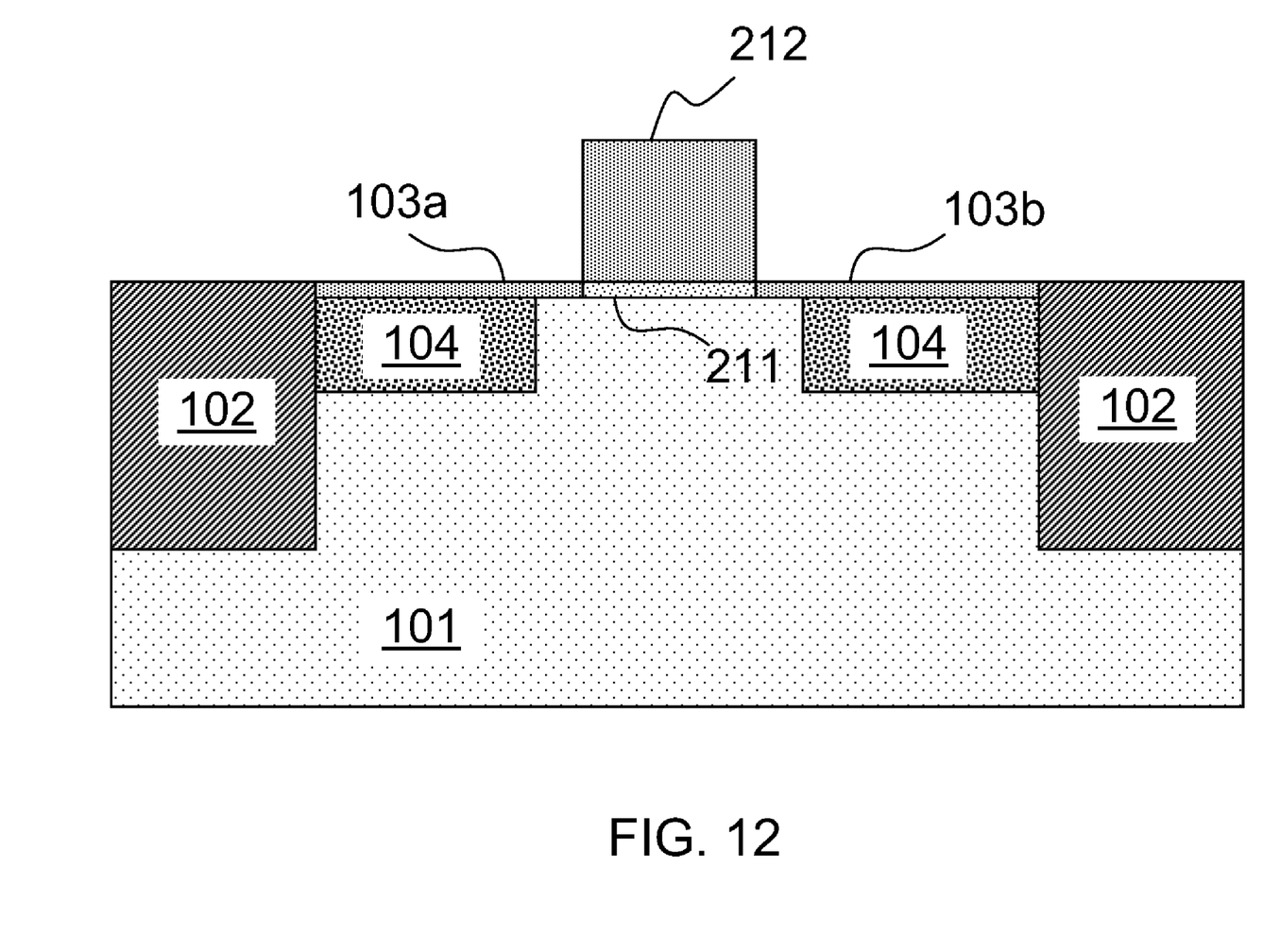
Figure 13:
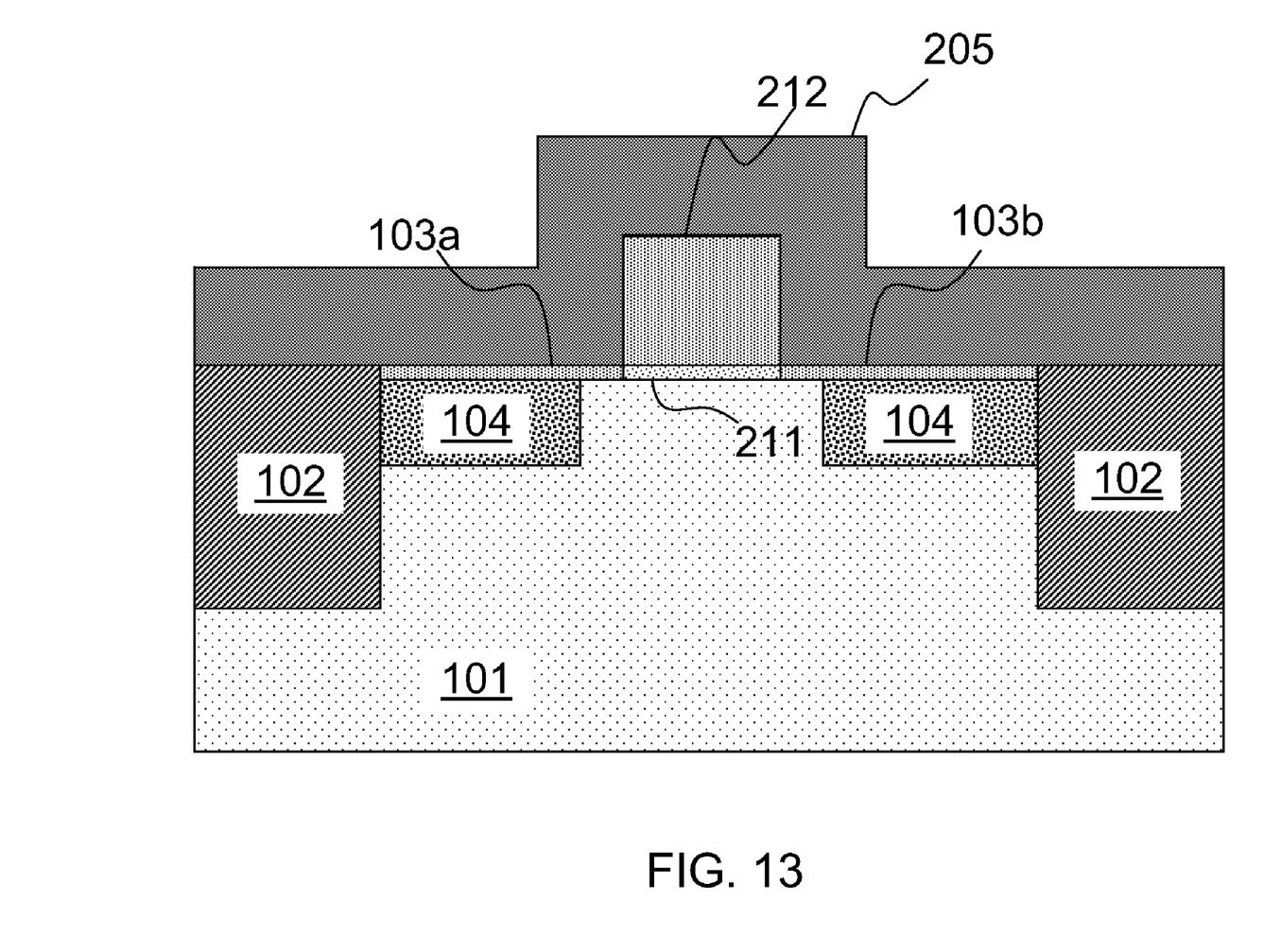

According to another embodiment, following the step as shown in FIG. 6, the at least partially relaxed (due to the opening) stress liner 202 may be removed selectively, as illustrated in FIG. 12. In this case, material used in forming gate conductor 212 in step of FIG. 6 may be selected to have a relatively high Young's modulus (for example, equal to or higher than that of polysilicon) such that gate conductor 212 may be able to hold or retain (to certain extent) the strain, which may be caused by the compressive stress of stress liner 202, in the channel region underneath gate conductor 212. In other words, the stress in the channel region of FET 100 may be relaxed, if any, to a lesser extent upon the removal of stress liner 202. Upon forming source/drain and silicide at the source/drain regions, if necessary and not formed previously, a new stress liner 205 may be formed on top of FET 100 as illustrated in FIG. 13 according to yet another embodiment.

Stress liner 205 may further strengthen the strain applied to the channel region underneath gate conductor 212 and gate dielectric 211.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method of applying stress to a channel region underneath a gate of a field-effect-transistor, said field-effect-transistor (FET) including said gate, a source region, and a drain region, said method comprising:
    embedding stressors in said source and drain regions of said FET;
    forming a stress liner covering said gate of said FET and said source and drain regions;
    removing a portion of said stress liner, said portion of said stress liner being located on top of said gate, said gate being a gate conductor;
    removing said gate conductor of a first gate material and a layer of gate oxide underneath, thus creating an opening therein; and
    filling said opening with a second gate material.

2. The method of claim 1, further comprising, after filling said opening with said second gate material, removing said stress liner that covers said source and drain regions of said FET.

3. The method of claim 1, wherein said first gate material has a Young's modulus value being smaller than 130 GPa, preferably smaller than 115 GPa, and more preferably smaller than 100 GPa.

4. The method of claim 1, wherein said first gate material is selected from the group consisting of $Si_{0.8}Ge_{0.2}$, $Si_{0.5}Ge_{0.5}$, Ge, GaP, GaAs, $Al_{0.5}Ga_{0.5}As$, AlAs, InP, InAs, ZnO, ZnS, ZnSe, CdS, and CdTe.

5. The method of claim 1, wherein said second gate material has a Young's modulus value being equal to or larger than 130 GPa.

6. The method of claim 1, further comprising forming a new layer of gate oxide in said opening before filling said opening with said second gate material.

7. The method of claim 1, wherein said removing said gate conductor comprises:
    exposing a top portion of said gate by applying a chemical-mechanical-polishing technique; and
    etching said gate of said first gate material selective to the material of said stress liner.

8. The method of claim 1, wherein said removing said gate conductor comprises:
    covering said stress liner with a dielectric material;
    exposing a top portion of said gate by applying a chemical-mechanical-polishing technique; and
    etching said gate of said first gate material selective to said dielectric material.

9. The method of claim 1, further comprising forming spacers on sidewalls of said opening before filling said opening with said second gate material.

10. The method of claim 1, wherein said stress liner is a non-stress liner having a stress value substantially close to zero.

11. The method of claim 2, further comprising, after removing said stress liner covering said source and drain regions, forming a new stress liner covering said gate of said second gate material and said source and drain regions of said FET.

12. A method of applying stress to a channel region underneath a gate of a field-effect-transistor, said field-effect-transistor (FET) including said gate, a source region, and a drain region, said method comprising:
    forming said gate of said FET with a gate material, said gate material having a Young's modulus value being smaller than 130 GPa, preferably smaller than 115 GPa, and more preferably smaller than 100 GPa;
    forming stressors at the two sides of said gate, said gate being a gate conductor and said stressors including a stress liner covering said gate and said source and drain regions of said FET; and
    removing said gate conductor of said gate material and a layer of gate oxide underneath, thereby creating an opening therein.

13. The method of claim 12, wherein said gate material is a first gate material, further comprising:
    before removing said gate conductor of said first gate material, removing a portion of said stress liner, said portion of said stress liner being located on top of said gate; and
    after removing said gate conductor of said first gate material, filling said opening with a second gate material.

14. The method of claim 12, wherein said gate material is selected from the group consisting of $Si_{0.8}Ge_{0.2}$, $Si_{0.5}Ge_{0.5}$, Ge, GaP, GaAs, $Al_{0.5}Ga_{0.5}As$, AlAs, InP, InAs, ZnO, ZnS, ZnSe, CdS, and CdTe.

15. The method of claim 13, further comprising, after filling said opening with said second gate material, removing said stress liner that covers said source and drain regions of said FET.

16. The method of claim 13, further comprising forming a new layer of gate oxide in said opening before filling said opening with said second gate material.

17. The method of claim 13, wherein said removing said gate conductor comprises:
    exposing a top portion of said gate by applying a chemical-mechanical-polishing technique; and
    etching said gate of said first gate material selective to the material of said stress liner.

18. A method of applying stress to a channel region underneath a gate of a field-effect-transistor, said field-effect-transistor (FET) including said gate, a source region, and a drain region, said method comprising:
    embedding stressors in said source and drain regions of said FET;
    forming a stress liner covering said gate of said FET and said source and drain regions;
    removing a portion of said stress liner, said portion of said stress liner being located on top of said gate;
    removing said gate of a first gate material and a layer of a first gate oxide underneath, thus creating an opening therein;
    filling said opening with a layer of a second gate oxide;
    filling a second gate material on said layer of said second gate oxide; and
    removing said stress liner that covers said source and drain regions of said FET.

19. The method of claim 18, further comprising, after removing said stress liner, forming a new stress liner covering said second gate material and said source and drain regions of said FET.

* * * * *